United States Patent [19]
Nicholes

[11] Patent Number: 5,406,525
[45] Date of Patent: Apr. 11, 1995

[54] CONFIGURABLE SRAM AND METHOD FOR PROVIDING THE SAME

[75] Inventor: James W. Nicholes, Gilbert, Ariz.

[73] Assignee: Motorola, Inc., Schaumburg, Ill.

[21] Appl. No.: 254,848

[22] Filed: Jun. 6, 1994

[51] Int. Cl.⁶ .................... G11C 13/00; H03K 19/177
[52] U.S. Cl. .......................... 365/230.02; 365/189.02; 365/230.03
[58] Field of Search ...................... 365/230.01, 230.02, 365/230.03, 230.09, 189.02, 189.04

[56] References Cited

U.S. PATENT DOCUMENTS 5,315,178  5/1994  Snidor .......................... 365/230.02

Primary Examiner—Terrell W. Fears
Attorney, Agent, or Firm—Gary W. Hoshizaki

[57] ABSTRACT

A configurable SRAM (21) is provided that is full diffused for increased speed and density and configurable for different word widths. Configuration signals are applied to control logic (28) for selecting a word width. The word width is smaller than or equal to a bit string of configurable SRAM (21). In a write operation, data input registers store and couple a word to a second bus. A shifter (27) receives the word from the second bus and shifts the bit locations of the word. A multiplexer (26) couples the shifted word to a first bus where write circuitry of read/write circuitry (24) writes the word to a selected bit string of a memory array (22) without affecting other bits of the selected bit string.

In a read operation, a selected bit string is provided from the memory array (22) to read circuitry. The read circuitry provides the selected bit string to the first bus. The multiplexer (26) couples a word from the selected bit string to the shifter (27). The shifter (27) shifts the bits of the word adjacent to one another on the second bus. Output drivers of the data input registers and output drivers (29) provide the word to other circuitry.

15 Claims, 9 Drawing Sheets

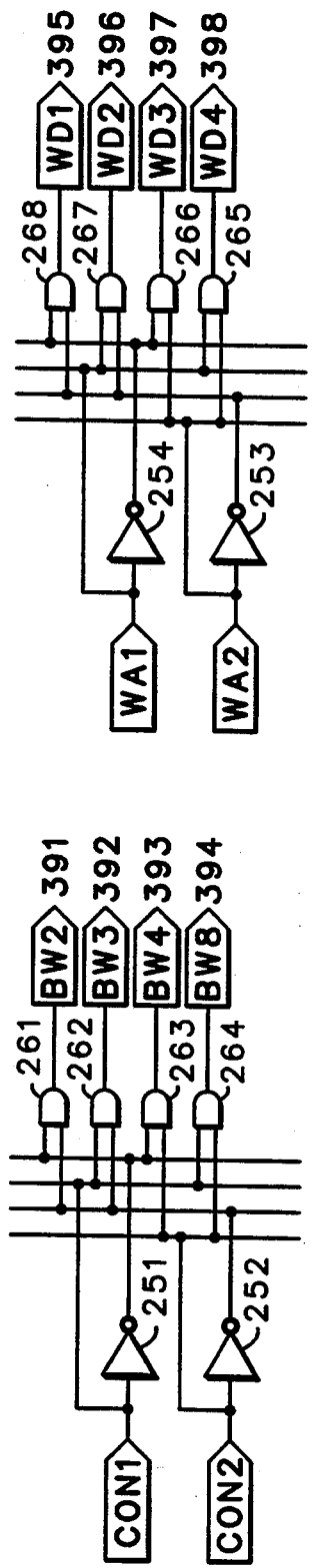
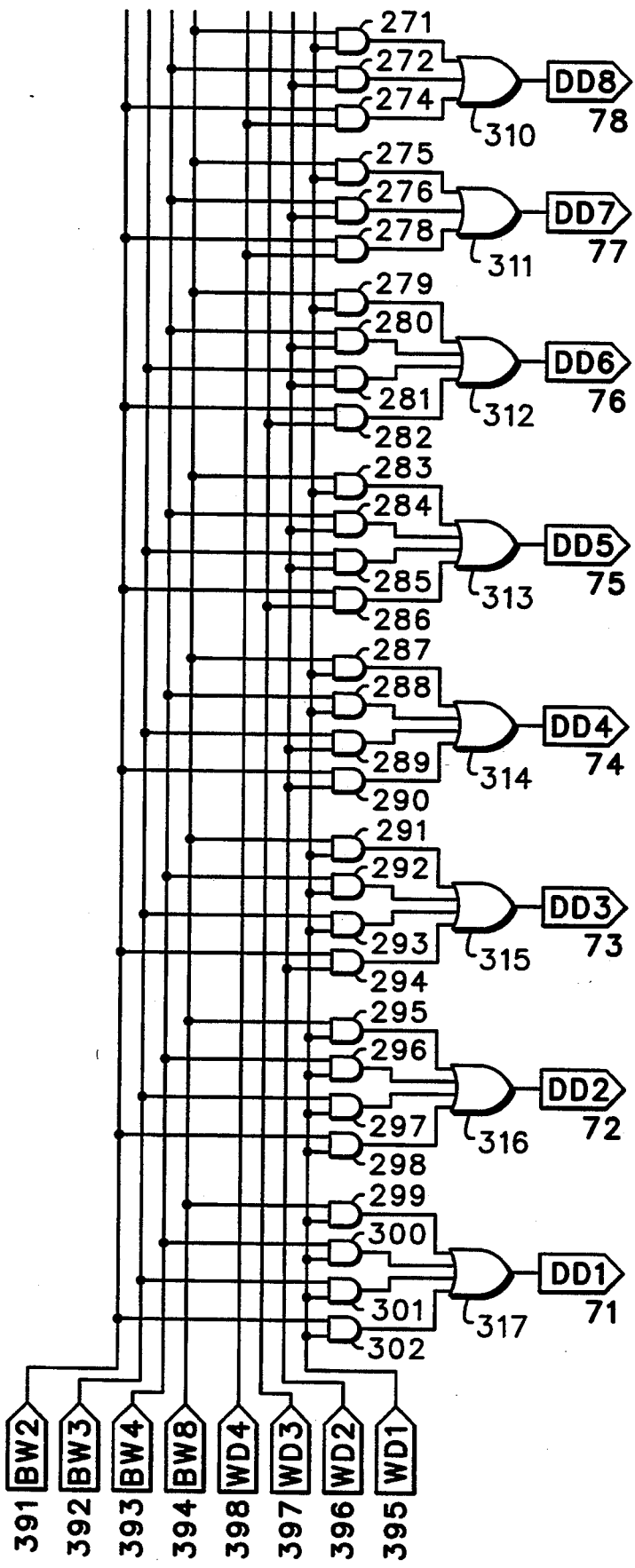
FIG. 9
250

| CONFIGURATION | | BIT WIDTH | | | | DESCRIPTION |
|---|---|---|---|---|---|---|
| CON2 | CON1 | BW8 | BW4 | BW3 | BW2 | |
| 0 | 0 | 0 | 0 | 0 | 1 | TWO BIT WORD WIDTH |
| 0 | 1 | 0 | 0 | 1 | 0 | THREE BIT WORD WIDTH |
| 1 | 0 | 0 | 1 | 0 | 0 | FOUR BIT WORD WIDTH |
| 1 | 1 | 1 | 0 | 0 | 0 | EIGHT BIT WORD WIDTH |

| WORD ADDRESS | | WORD | | | | DESCRIPTION |
|---|---|---|---|---|---|---|
| WA2 | WA1 | WD4 | WD3 | WD2 | WD1 | |
| 0 | 0 | 0 | 0 | 0 | 1 | 1st WORD OF 8 BIT STRING |
| 0 | 1 | 0 | 0 | 1 | 0 | 2nd WORD OF 8 BIT STRING |
| 1 | 0 | 0 | 1 | 0 | 0 | 3rd WORD OF 8 BIT STRING* |
| 1 | 1 | 1 | 0 | 0 | 0 | 4th WORD OF 8 BIT STRING* |

*IF APPLICABLE FOR THAT WORD WIDTH

| BIT WIDTH | | | | WORD | | | | DATA DRIVE ENABLE | | | | | | | |
|---|---|---|---|---|---|---|---|---|---|---|---|---|---|---|---|
| BW8 | BW4 | BW3 | BW2 | WD4 | WD3 | WD2 | WD1 | DD7 | DD6 | DD5 | DD4 | DD3 | DD2 | DD1 | DD8 |
| 0 | 0 | 0 | 1 | 0 | 0 | 0 | 1 | 0 | 0 | 0 | 0 | 0 | 1 | 1 | 0 |
| 0 | 0 | 0 | 1 | 0 | 0 | 1 | 0 | 0 | 0 | 0 | 1 | 1 | 0 | 0 | 0 |
| 0 | 0 | 0 | 1 | 0 | 1 | 0 | 0 | 0 | 1 | 1 | 0 | 0 | 0 | 0 | 0 |
| 0 | 0 | 0 | 1 | 1 | 0 | 0 | 0 | 1 | 0 | 0 | 0 | 0 | 0 | 0 | 1 |
| 0 | 0 | 1 | 0 | 0 | 0 | 0 | 1 | 0 | 0 | 0 | 0 | 1 | 1 | 1 | 0 |
| 0 | 0 | 1 | 0 | 0 | 0 | 1 | 0 | 0 | 1 | 1 | 1 | 0 | 0 | 0 | 0 |
| 0 | 0 | 1 | 0 | 0 | 1 | 0 | 0 | 0 | 0 | 0 | 0 | 0 | 0 | 0 | 0 |
| 0 | 0 | 1 | 0 | 1 | 0 | 0 | 0 | 0 | 0 | 0 | 0 | 0 | 0 | 0 | 0 |
| 0 | 1 | 0 | 0 | 0 | 0 | 0 | 1 | 0 | 0 | 0 | 1 | 1 | 1 | 1 | 0 |
| 0 | 1 | 0 | 0 | 0 | 0 | 1 | 0 | 1 | 1 | 1 | 0 | 0 | 0 | 0 | 1 |
| 0 | 1 | 0 | 0 | 0 | 1 | 0 | 0 | 0 | 0 | 0 | 0 | 0 | 0 | 0 | 0 |
| 0 | 1 | 0 | 0 | 1 | 0 | 0 | 0 | 0 | 0 | 0 | 0 | 0 | 0 | 0 | 0 |
| 1 | 0 | 0 | 0 | 0 | 0 | 0 | 1 | 1 | 1 | 1 | 1 | 1 | 1 | 1 | 1 |
| 1 | 0 | 0 | 0 | 0 | 0 | 1 | 0 | 0 | 0 | 0 | 0 | 0 | 0 | 0 | 0 |
| 1 | 0 | 0 | 0 | 0 | 1 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 |

*FIG. 10*

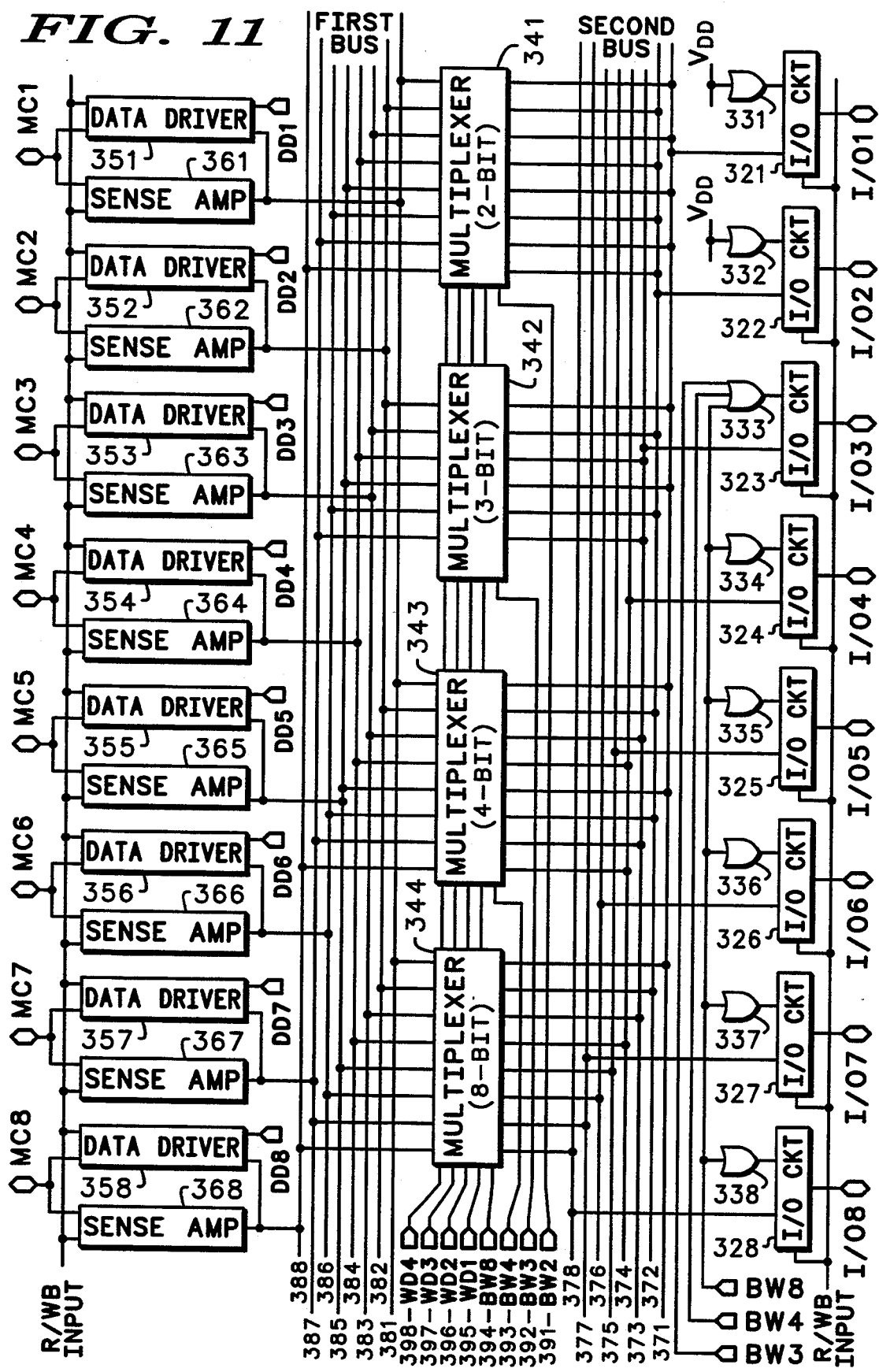

5,406,525

CONFIGURABLE SRAM AND METHOD FOR PROVIDING THE SAME

BACKGROUND OF THE INVENTION

This invention relates, in general, to semiconductor memories, and more particularly, to reconfigurable SRAMs (Static Random Access Memories) for providing a variety of different word widths.

Gate arrays are well known in the semiconductor arts for building semi-custom integrated circuits. A gate array is a semiconductor die fabricated with a large array of transistors and I/O (Input/Output) circuitry. A gate array is pre-processed up to a transistor level but does not include the interconnection of the transistor array and I/O circuitry. The only processing required to form a circuit on a gate array is metallization or interconnection of the transistor array to a user specific design. In general, two or three layers of metal are used for interconnection on a gate array.

Gate arrays are designed to be extremely efficient at forming simple logic blocks commonly used in digital circuits. For example, NAND gates, NOR gates, inverters, and flip flops. Efficiency of metallization (or routing) of a gate array is measured by the total number of transistors used versus the total number of transistors in the gate array. Circuits formed with the simple logic blocks described above typically achieve efficiencies of approximately 80 percent or less.

A problem common to a gate array is that they are inefficient in forming large complex circuit blocks. For example, a SRAM (static random access memory) is a circuit typically used in the design of a digital circuit that is classified as a large circuit block. Gate array manufacturers have minimally satisfied customer demands for SRAMs on gate arrays by providing :software to build an SRAM on a transistor array of a gate array. Memory intensive circuit designs use up a majority of a transistor array building a SRAM leaving only a small portion of the transistor array for building other circuitry. Moreover, a general trend for gate array users is to use larger memory sizes or multiple memories with different word widths. This is further complicated by an increasing need for more transistors to form other circuitry other than memories.

A SRAM formed in a transistor array of a SRAM is transistor intensive, each memory cell requires 6 transistors. Transistors of a gate array are not optimized for providing a memory cell having small dimensions. In fact, just the opposite is true, a transistor grouping on a transistor array is arranged for providing routing channels to simplify metallization. Furthermore, gate array memories fall short on performance and density when compared to commercially available memories. It is well known that SRAMs designed for the commercial market have memory cells that are optimized for memory cell size to increase both density and performance. Full custom SRAMs are known as "full diffused" SRAMs as all circuit elements are customized to maximize performance and decrease size. This approach works well since a semiconductor manufacturer sells millions of memories of a single type. On a gate array the opposite is true, each user may require a different memory size and a different memory word width. Flexibility is an important parameter for any memory provided on a gate array.

It would be of great benefit if a SRAM could be provided that is easily implemented on a gate array, has increased density and has performance approaching that of a full diffused memory, and is configurable for different word widths.

BRIEF DESCRIPTION OF THE DRAWINGS

FIG. 5 is a diagram of a bit string of a memory having 8 bits including text for illustrating how the bit string is divided to form 8, 4, 3, and 2 bit words in accordance with the present invention;

FIG. 7 is a logic diagram illustrating the input combinations to the control logic circuit of FIG. 6 and the resulting logic levels at each output;

FIG. 9 is a schematic diagram of an alternate version of control logic circuitry for a configurable memory in accordance with the present invention;

FIG. 10 is a logic diagram illustrating the input combinations to the control logic circuit of FIG. 9 and the resulting logic levels at each output; and FIG. 11 is a schematic diagram of alternate circuitry for coupling a word to a bit string in accordance with the present invention, the alternate circuitry is controlled by the control logic circuitry of FIG. 9.

DETAILED DESCRIPTION OF THE DRAWINGS

Figure 1:
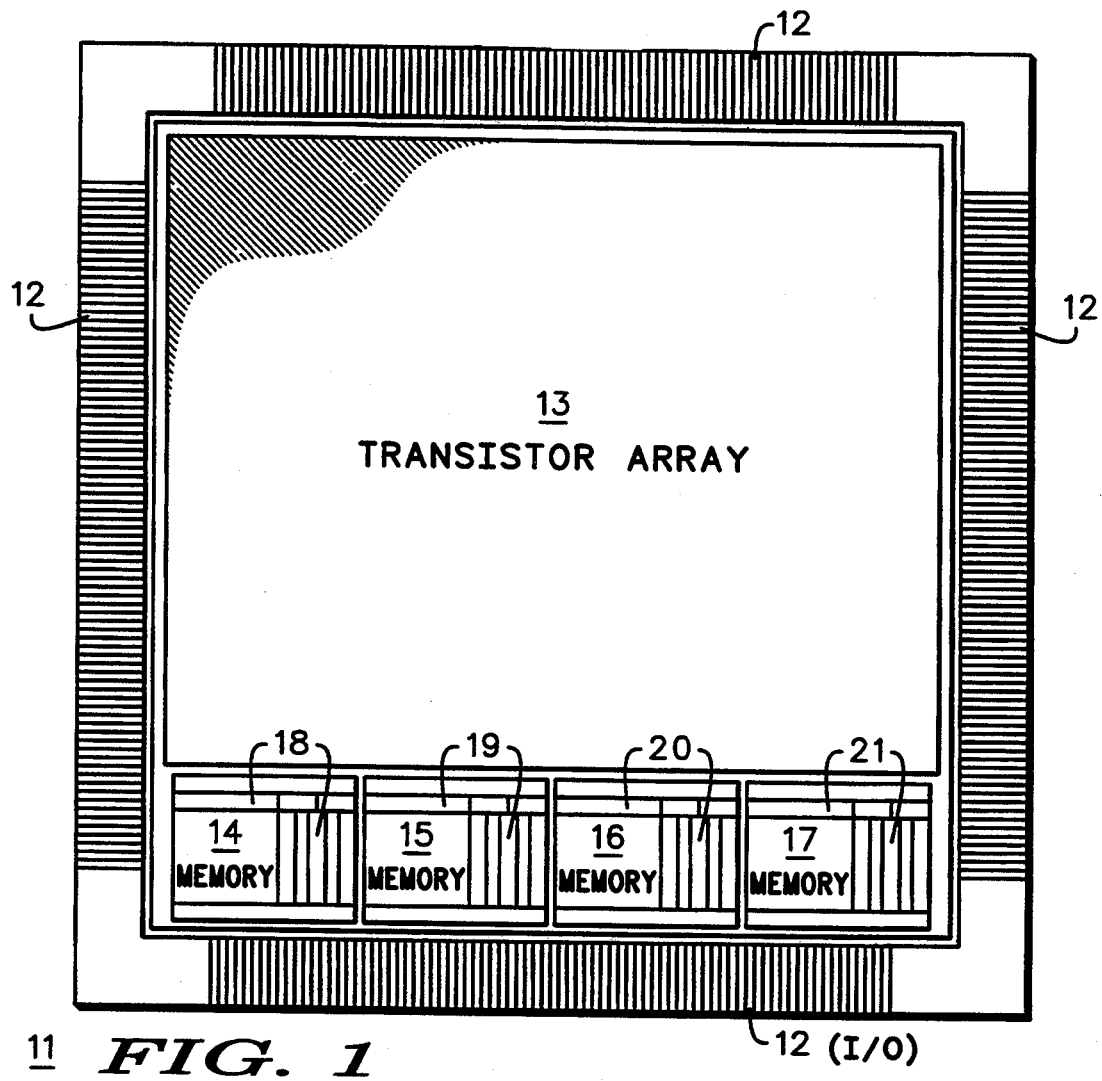
FIG. 1 is an illustration of a gate array having four full diffused configurable SRAMs.

In general, a SRAM (Static Random Access Memory) is characterized by such parameters as total number of memory bits, read time, write time, and word width. It is well known that commercially available SRAMs (or full diffused SRAMs) are designed having memory cells of the smallest possible dimensions. A small memory cell size maximizes circuit density, increase memory speeds, and reduce die costs. Typically, a SRAM of this type is offered having a specific word width which cannot be changed. SRAMs that are optimized as described above are known as "full diffused SRAMs" because they are fully customized for a specific application.

Conversely, a SRAM formed on a transistor array of a gate array is not optimized for density. As mentioned previously, a transistor array of a gate array is designed to maximize metal routing channels to simplify interconnection of the transistors to form different types of circuits (other than SRAMs). In other words, the transistors of a gate array are deliberately spaced apart from one another to increase the number of paths in which metal can be routed to couple to the terminals of each transistor. A SRAM formed on a transistor array of a gate array is extremely inefficient for even small memory sizes and results in an SRAM having inferior performance characteristics when compared to full diffused SRAMs. For example, a SRAM built on a transistor array of a gate array is approximately 3 times larger than a full diffused SRAM and approximately 20% slower.

An ideal SRAM for a gate array would be configurable for providing a variety of word widths thereby meeting the requirements of a wider memory user audience. The ideal SRAM would have performance characteristics close to that of commercially available SRAMS. The ideal SRAM could be easily integrated into a gate array without affecting such functions as metal routing of the transistor array or the computer aided design tool set used in generating a customer specific circuit on a gate array. Finally, the ideal SRAM would not require a large portion of a gate array thereby increasing the amount of usable gates for designing circuits other than memory.

A solution that meets these requirements is a "full diffused configurable SRAM" placed on a gate array. Circuitry is added to a full diffused SRAM to make it configurable for different wordwidths. The main portion of the configurable SRAM has dimensions comparable to a commercially available (full diffused) SRAM thereby reducing the area required on a gate array. For example, a memory cell is optimized for minimum size by applying minimum spacing rules to the layout. A full diffused SRAM will operate at speeds significantly faster than a SRAM formed on a transistor array. In the preferred embodiment, a configurable SRAM is metallized (interconnected) such that standard gate array routing is unaffected. For example, a configurable SRAM is interconnected in a first metal layer allowing subsequent metal layers to be used to route over the memory.

FIG. 1 is an illustration of a gate array 11 having four full diffused memories 14–17, each memory respectively having circuitry 18–21 for generating different word widths. Gate array 11 has I/O (inputs/Outputs) 12 and a transistor array 13. Transistor array 13 is configured to a user specific circuit design via several layers of interconnect metal as is well known by one skilled in the art. I/O 12 are input and output circuits for buffering signals into and out of gate array 11.

In the preferred embodiment, more than one full diffused memory is placed on gate array 11 to provide the option of including more than one memory in a gate array circuit. Each memory can have a different word width. For example, memories 14–17 could be respectively configured for 8, 12, 16, and 32 bits. Each memory is independent from the other memories and is configurable for a wide variety of word widths. If a larger memory is required memories 14–17 are coupled in parallel. If memories 14–17 were not full diffused memories, but were formed from transistor array 13 they would take up more than half (approximately 80%) of transistor array 13.

Figure 2:
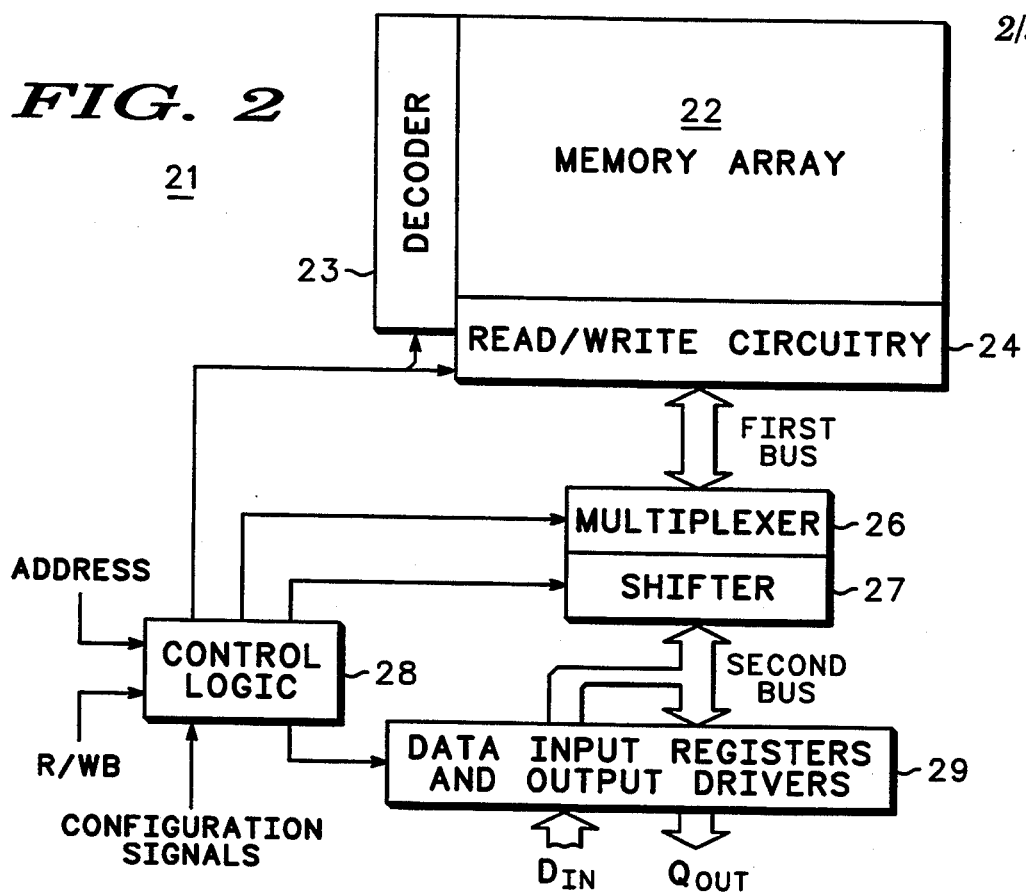
FIG. 2 is a block diagram of a configurable SRAM in accordance with the present invention.

FIG. 2 is a block diagram of a configurable memory 21 that is configurable for a variety of wordwidths. Configurable memory 21 comprises a memory array 22, a decoder 23, read/write circuitry 24, a multiplexer 26, a shifter 27, control logic 28, and data input registers and output drivers 29. In the preferred embodiment, configurable memory 21 is full diffused to minimize die area and maximize operation speed.

Decoder 23, memory array 22, and read/write circuitry 24 operate similar to that of a standard commercially available memory. Decoder 23 couples to memory array 22 for selecting a bit string contained therein. Read/write circuitry 24 couples to memory array 22 for reading or writing to a selected bit string of memory array 22. Both decoder 23 and read/write circuitry 24 receive control signals from control logic 28. Read/Write circuitry 24 is responsive to control logic 28 for either reading or writing to specific bit locations of a selected bit string in memory array 22.

The bit strings of memory array 22 each have a predetermined number of bits. The predetermined number of bits of each bit string is chosen to provide a number of different word widths that are commonly used for circuit designs. For example, a memory array 22 having a total number of 18432 bits and a bit string comprising 36 bits will have a total of 512 bit strings. Table 1, shown hereinafter, lists examples of common word widths that are formed from memory array 22 having each bit string of the memory comprising 36 bits. The number of words contained within each bit string is also listed.

TABLE 1

| Number of Words | Word width | Words per bit string |
| --- | --- | --- |
| 512 words | 36 bits | 1 |
| 1024 words | 18 bits | 2 |
| 1536 words | 12 bits | 3 |
| 2048 words | 9 bits | 4 |
| 2048 words | 8 bits | 4 |
| 3072 words | 6 bits | 6 |
| 4196 words | 4 bits | 9 |
| 6144 words | 3 bits | 12 |
| 8192 words | 2 bits | 18 |

Referring back to FIG. 2, multiplexer 26, shifter 27, control logic 28, read/write circuitry 24, and data input registers and output drivers 29 manipulate portions of a bit string to form a word. Multiplexer 26 couples to read/write circuitry 24 via a first bus and couples to shifter 27. Shifter 27 couples to data input registers and output drivers 29 via a second bus. Multiplexer 26, shifter 27, and data input registers and output drivers 29 receive control signals from control logic 28.

Control logic 28 receives an address, a Read/Writebar (R/WB) signal, and configuration signals for selecting a word width for configurable memory 21. An input bus Din couples to data input registers of data input registers and output drivers 29. An output bus Qout couples to output drivers of data input registers and output drivers 29.

Figure 3:
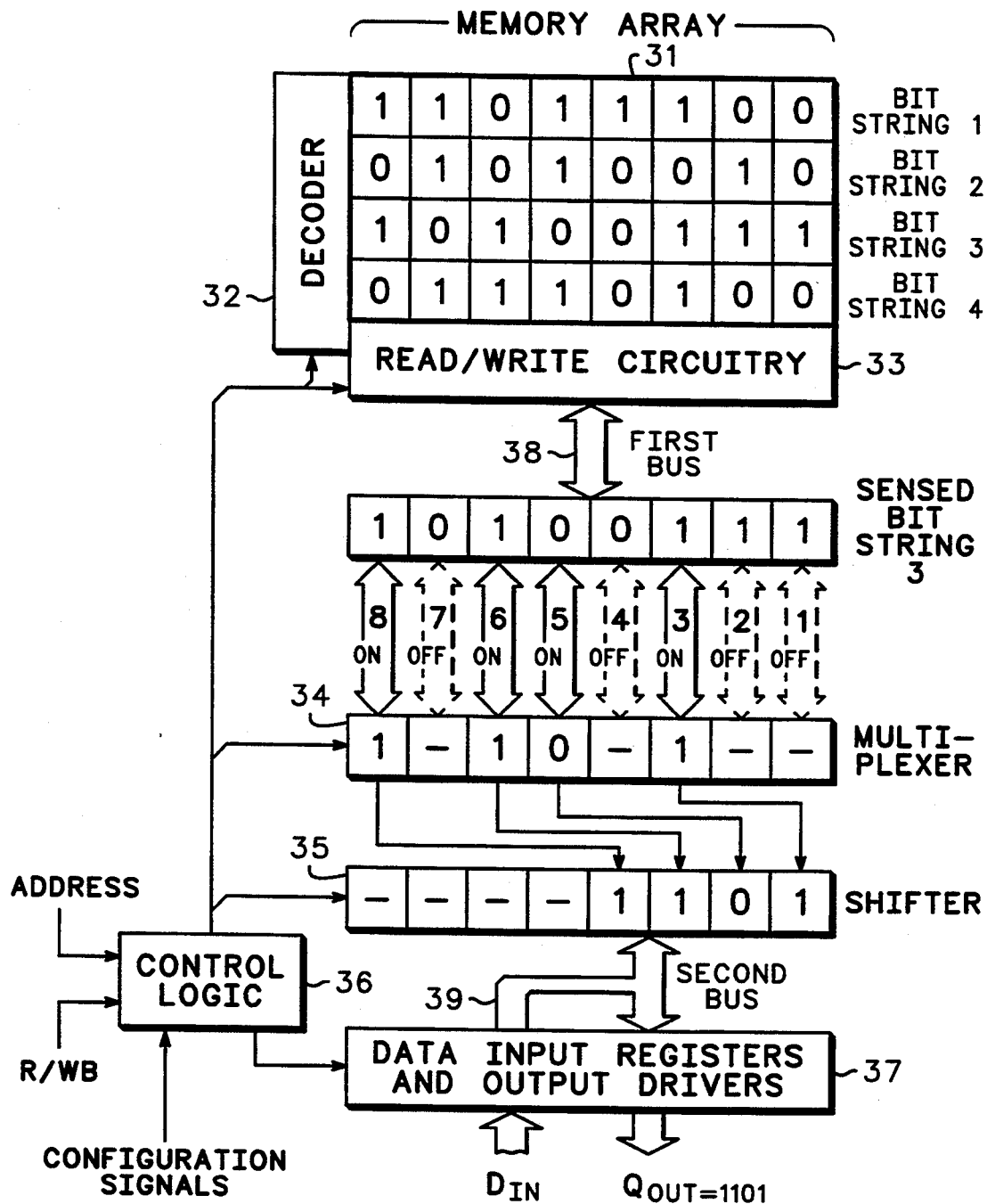
FIG. 3 is a simplified diagram of the configurable SRAM of FIG. 2 performing a read operation in accordance with the present invention.

Operation of configurable memory 21 is best described by example. FIG. 3 is a simplified diagram of a configurable memory 30 corresponding to configurable memory 21 of FIG. 2. Configurable memory 30 is shown performing a read operation. A memory array 31, a decoder 32, read/write circuitry 33, a multiplexer 34, a shifter 35, control logic 36, and data input registers and output drivers 37 respectively correspond to memory array 22, decoder 23, read/write circuitry 24, multiplexer 26, shifter 27, control logic 28, and data input registers and output drivers 29 of configurable memory 21 of FIG. 2.

Configuration signals applied to control logic 36 configure configurable memory 30 for a word width of four bits. A Read/Writebar (R/WB) signal applied to control logic 36 places configurable memory in a read mode by disabling write circuitry of read/write circuitry 33 and data input registers of data input registers and output drivers 37. An address applied to control logic 36 corresponds to a bit string of memory array 31 and a word of the bit string.

Memory array 31 comprises four bits strings (numbered 1–4), each bit string having 8 bits. In the preferred embodiment, each bit string of memory array 31 will contain two four bit words. For this example, an address applied to control logic 36 causes decoder 32 to select bit string #3. Read circuitry of read/write circuitry 33 senses the logic levels of each bit of bit string #3 and outputs the logic levels to a first bus 38. The logic levels of bit string #3 are shown on first bus 38 as sensed bit string #3. A portion of the address applied to control logic 36 enables multiplexer 34 to couple one of the two words stored in bit string #3 to shifter 35. In this example the four bit word comprises bit locations 8, 6, 5, and 3 respectively corresponding to logic levels 1, 1, 0, and 1 (bit locations 7, 4, 2, and 1 are inhibited from coupling to shifter 35). The other word within bit string #3 would comprise bit locations 7, 4, 2, and 1. It should be noted that the bit locations which form the word within the bit string are not critical and were chosen as an example.

Shifter 35 shifts the word (1, 1, 0, 1) coupled through multiplexer 34 to bit locations 1–4 of a second bus 39. Output drivers of data input registers and output drivers 37 coupled to bit locations 1–4 of the second bus are enabled by control logic 36 (output drivers coupled to bit locations 5–8 are disabled). The output drivers buffer configurable memory 30 for driving the logic levels of the word (1, 1, 0, 1) onto the Qout bus.

Figure 4:
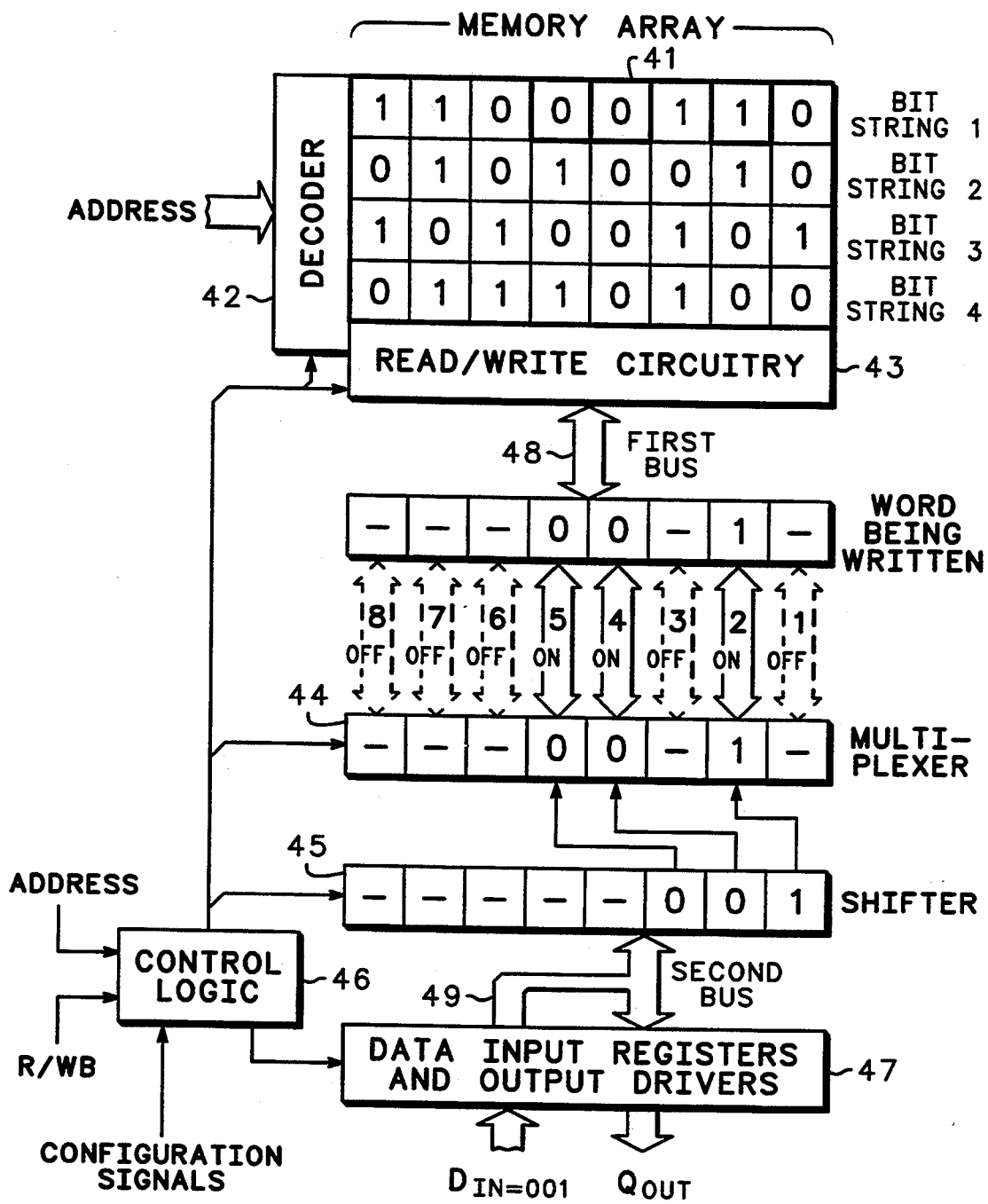
FIG. 4 is a simplified diagram of the configurable SRAM of FIG. 2 performing a write operation in accordance with the present invention.

FIG. 4 is a simplified diagram of a configurable memory 40 corresponding to configurable memory 21 of FIG. 2. Configurable memory 40 is shown performing a write operation. A memory array 41, a decoder 42, read/write circuitry 43, a multiplexer 44, a shifter 45, control logic 46, and data input registers and output drivers 47 respectively correspond to memory array 22, decoder 23, read/write circuitry 24, multiplexer 26, shifter 27, control logic 28, and data input registers and output drivers 29 of configurable memory 21 of FIG. 2. Configurable memory 40 has a maximum word width of 8 bits.

Configuration signals applied to control logic 46 configure configurable memory 40 for a three bit word. In the preferred embodiment, a Din bus (three bits wide) couples to data input registers of data input registers and output drivers 47 corresponding to bit locations 1–3. Data input registers corresponding to bit locations 4–8 are disabled by control logic 46. A Read/WriteBar (R/WB) signal enables data input registers (corresponding to bit locations 1–3) for storing a word (0, 0, 1), disables output drivers of data input registers and output drivers 47, disables read circuitry of read/write circuitry 43, and enables write circuitry of read/write circuitry 43.

Shifter 45 receives the word at bit locations 3, 2, and 1 and respectively shifts the word to bit locations 5, 4, and 2 of multiplexer 44. A portion of the address applied to control logic 46 determines the word location within a bit string of memory array 41. Control logic 46 enables bit locations 5, 4, and 1 of multiplexer 44 for passing logic levels of the word to a first bus 48. The word (0, 0, 1) is shown on first bus 48. Write circuitry of read/write circuitry 43 is enabled by control logic 46 for writing to bit locations 5, 4, and 2. Bit locations 8, 7, 6, 3, and 1 remain at their previous logic state.

In this example, a portion of the address applied to control logic 46 is coupled to decoder 42 for selecting bit string #1. Write circuitry writes the word (0, 0, 1) to bit locations 5, 4, and 2 as indicated by a bold outline of the bits of bit string #1.

FIG. 5 is a diagram of a bit string having 8 bits for illustrating how the bit string is subdivided to form different word widths. In general, a word width chosen for a configurable SRAM has less bits than a bit string provided from a memory array. This is done deliberately to allow a variety of word widths to be programmably derived from the bit string.

For example, the bit string having 8 bits is shown in FIG. 5, each bit is identified by a bit number. The bit string can be divided up to provide word widths from 1 bit to 8 bits, but for illustration purposes 8 bit, 4 bit, 3 bit, and 2 bit word widths are shown. An 8 bit word obviously uses the entire bit string and would not need any additional circuitry for generating the word width. Two four bit words are stored within the bit string. In this example, bits 1–4 form a first four bit word and bits 5–8 form a second four bit word. Only two, three bit words can be formed from the bit string leaving two bits unused. Bits 1–3 form a first word and bits 5–7 form a second word. Four, two bit words are formed from the bit string, bits 1–2 form a first word, bits 3–4, form a second word, bits 5–6 form a third word, and bits 7–8 form a fourth word. The example described herein above illustrates how a bit string can be divided, a similar approach should be taken for a larger bit string.

Figure 6:
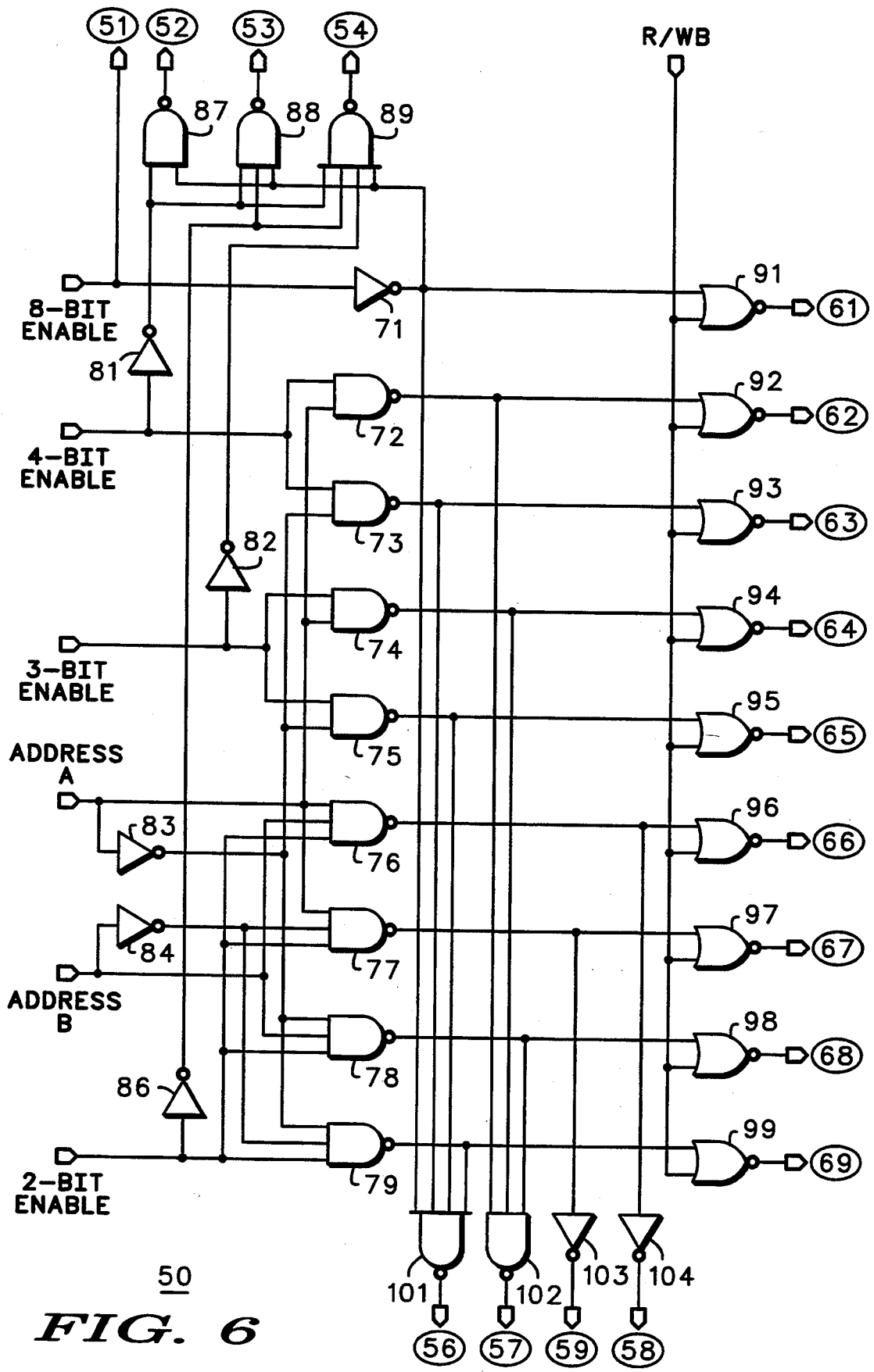
FIG. 6 is a schematic diagram of a control logic circuit for a configurable memory in accordance with the present invention.

FIG. 6 is a schematic diagram of a control logic circuit 50 for programming a memory (not shown) for different word widths in conjunction with a multiplexer/shifter circuit (not shown). Control logic circuit 50 generates control signals for reading and writing to a bit string having 8 bits for word widths of 8 bits, 4 bits, 3 bits, and 2 bits. Control logic circuit 50 generates different word widths from a bit string as shown in FIG. 5. Control logic circuit 50 couples to circuitry shown in FIG. 8.

Control logic circuit 50 has 8, 4, 3, and 2 bit enable inputs for selecting a word width. One of the 8, 4, 3, and 2 bit enable inputs is selected via a logic one level, the other remaining enable inputs receive logic zero levels. Address A and B identify which word in a bit string is being selected. Address A and B is not used for an 8 bit word width. Address A is used to identify the first and second words of the 4 and 3 bit word widths. Address A and B are used to identify the first through fourth words of the 2 bit word width.

An 8 bit enable input and NAND gates 87–89 provide signals for enabling and disabling I/O (Input/Output) circuitry of a memory. The 8 bit enable input is coupled to a node 51 and an input of an inverter 71. Inverters 71, 81, 82, and 86 have an input respectively coupled to the 8, 4, 3, and 2 bit enable inputs. NAND gate 87 has a first input coupled to an output of inverter 71, a second input coupled to an output of inverter 81, and an output coupled to a node 52. NAND gate 88 has a first input coupled to the output of inverter 71, a second input coupled to the output of inverter 81, a third input coupled to an output of inverter 82, and an output coupled to a node 53. NAND gate 89 has a first input coupled to the output of inverter 71, a second input coupled to the output of inverter 81, a third input coupled to the output of inverter 82, a fourth input coupled to an output of inverter 86, and an output coupled to a node 54.

Inverter 71 and NAND gates 72–79 generate signals for selecting a word of a bit string. Address A and B are used in conjunction with the 8, 4, 3, and 2 bit enable inputs for generating the signals. An inverter 83 has an input coupled to Address A and an output. An inverter 84 has an input coupled to Address B and an output. Inverter 71 generates a signal for selecting an 8 bit word (corresponding to the entire bit string).

NAND gates 72 and 73 generate signals for respectively selecting first and second 4 bit words of a bit string. NAND gate 72 has a first input coupled to the 4 bit enable input, a second input coupled to Address A, and an output. NAND gate 73 has a first input coupled to the 4 bit enable input, a second input Coupled to the output of inverter 83, and an output.

NAND gates 74 and 75 generate signals for respectively selecting first and second 3 bit words of a bit string. NAND gate 74 has a first input coupled to the 3 bit enable input, a second input coupled to Address A, and an output. NAND gate 75 has a first input coupled to the 3 bit enable input, a second input coupled to the output of inverter 83, and an output.

NAND gates 76–79 generate signals for respectively selecting first, second, third, and fourth 2 bit words of a bit string. NAND gate 76 has a first input coupled to Address A, a second input coupled to Address B, a third input coupled to the 2 bit enable input, and an output. NAND gate 77 has a first input coupled to Address A, a second input coupled to the output of inverter 84, a third input coupled to the 2 bit enable input, and an output. NAND gate 78 has a first input coupled to the output of inverter 83, a second input coupled to Address B, a third input coupled to the 2 bit enable input, and an output. NAND gate 79 has a first input coupled to the output of inverter 83, a second input coupled to the output of inverter 84, a third input coupled to the 2 bit enable input, and an output.

NOR gates 91–99 enable data drivers for writing to selected portions of a bit string. NOR gate 91 generates a signal for enabling all 8 data drivers for writing to an entire bit string (8 bit word width). NOR gate 91 has a first input coupled to the output of inverter 71, a second input coupled to a R/WB input, and an output coupled to a node 61. A logic zero level at the R/WB input enables NOR gates 91–99 for writing to the configurable memory.

NOR gates 92 and 93 enable data drivers for writing a four bit word. NOR gates 92 generates a signal for enabling data drivers that write to bits 5–8 of a bit string. NOR gate 92 has a first input coupled to the output of NAND gate 72, a second input coupled to the R/WB input, and an output coupled to a node 62. NOR gate 93 generates a signal for enabling data drivers that write to bits 1–4 of a bit string. NOR gate 93 has a first input coupled to the output of NAND gate 73, a second input coupled to the R/WB input, and an output coupled to node a 63.

NOR gates 94 and 95 enable data drivers for writing a three bit word. NOR gate 94 generates a signal for enabling data drivers that write to bits 5–7 of a bit string. NOR gate 94 has a first input coupled to the output of NAND gate 74, a second input coupled to the R/WB input, and an output coupled to a node 64. NOR gate 95 generates a signal for enabling data drivers that write to bits 1–3. NOR gate 95 has a first input coupled to the output of NAND gate 75, a second input coupled to the R/WB input, and an output coupled to a node 65.

NOR gates 96–99 enable data drivers for writing a two bit word. NOR gate 96 generates a signal for enabling data drivers that write to bits 7 and 8 of a bit string. NOR gate 96 has a first input coupled to the output of NAND gate 76, a second input coupled to the R/WB input, and an output coupled to a node 66. NOR gate 97 generates a signal for enabling data drivers that write to bits 3 and 4 of a bit string. NOR gate 97 has a first input coupled to the output of NAND gate 77, a second input coupled to the R/WB input, and an output coupled to a node 67. NOR gate 98 generates a signal for enabling data drivers that write to bits 5 and 6 of a bit string. NOR gate 98 has a first input coupled to the output of NAND gate 78, a second input coupled to the R/WB input, and an output coupled to a node 68. NOR gate 99 generates a signal for enabling data drivers that write to bits 1 and 2 of a bit String. NOR gate 99 has a first input coupled to the output of NAND gate 79, a second input coupled to the R/WB input, and an output coupled to a node 69.

NAND gates 101 and 102, and inverters 103 and 104 enable multiplexers for coupling I/O (Input/Output) circuitry to read/write circuitry (sense amps/data drivers). NAND gate 101 generates a signal for enabling a first multiplexer. NAND gate 101 has a first input coupled to the output of inverter 71, a second input coupled to the output of NAND gate 73, a third input coupled to the output of NAND gate 75, a fourth input coupled to the output of NAND gate 79, and an output coupled to a node 56. NAND gate 102 generates a signal for enabling a second multiplexer. NAND gate 102 has a first input coupled to the output of NAND gate 72, a second input coupled to the output of NAND gate 74, a third input coupled to the output of NAND gate 78, and an output coupled to a node 67. Inverter 103 generates a signal for enabling a third multiplexer. Inverter 103 has an input coupled to the output of NAND gate 77 and an output coupled to a node 59. Inverter 104 generates a signal for enabling a fourth multiplexer. Inverter 104 has an input coupled to the output of NAND gate 76 and an output coupled to a node 58.

FIG. 7 is a logic diagram illustrating the input combinations to control logic circuit 50 and the resulting output logic levels. An X residing in either Address A or B columns indicates that the logic level does not affect the output logic levels.

Figure 8:
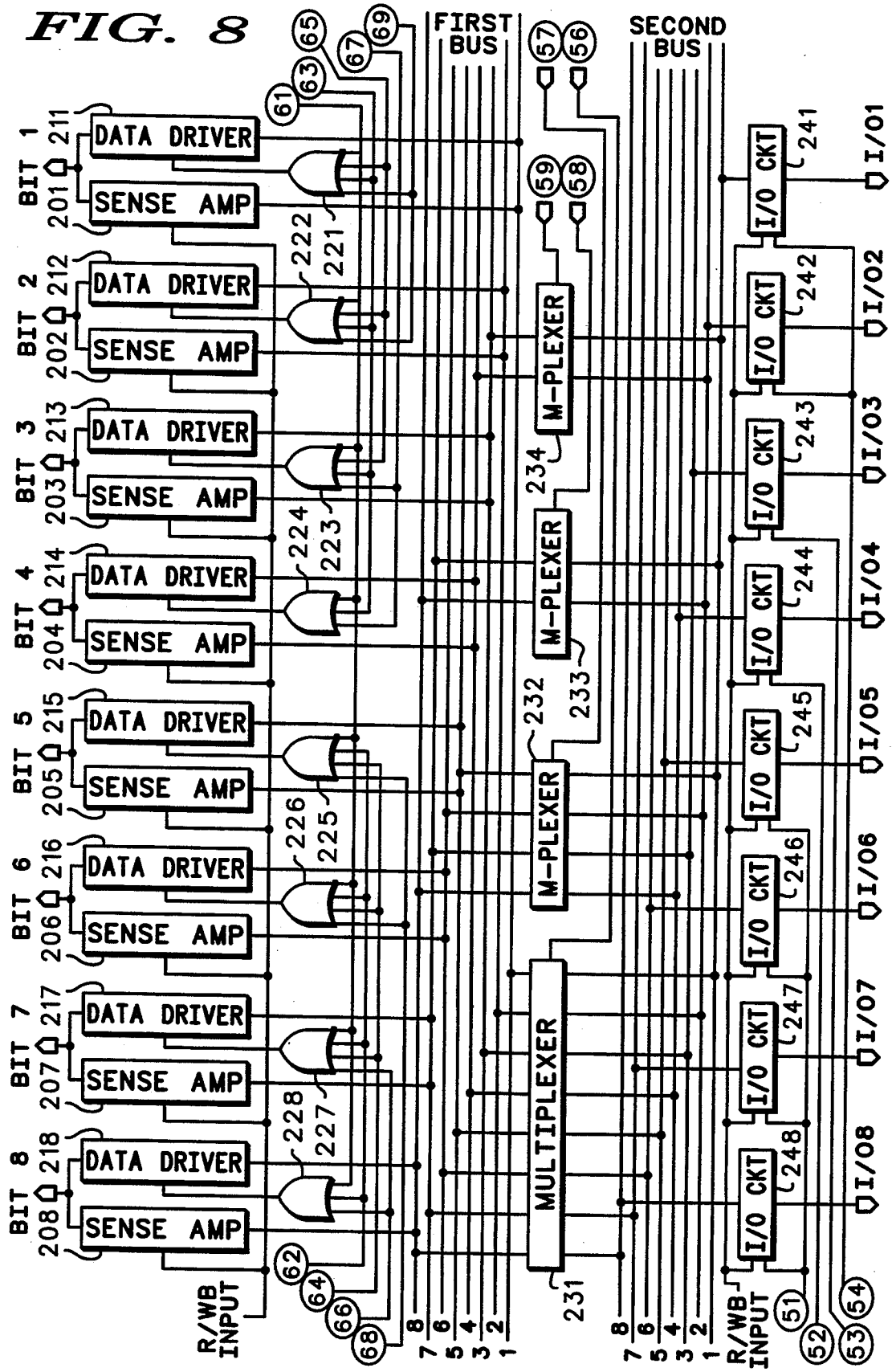
FIG. 8 is a schematic diagram of circuitry for coupling a word to a bit string in accordance with the present invention, the circuitry is controlled by the control logic circuit of FIG. 6.

FIG. 8 is a schematic diagram illustrating circuitry for making a SRAM configurable. Control logic circuitry shown in FIG. 6 couples to the circuitry in FIG. 8. Portions of a SRAM well known in the art such as the memory array or decode circuitry are not shown in FIG. 8. The portion of an SRAM not, shown selects and provides access to a selected bit string at terminals BITs 1–8.

Sense amps 201–208 each sense a logic level of a bit of a selected bit string coupled to terminals BITs 1–8. Sense amps 201–208 have a first terminal respectively coupled to terminals BITs 1–8, a second terminal coupled to R/WB input, and an output respectively coupled to bus lines 1–8 of a first bus. In the preferred embodiment, a logic one level applied to the R/WB input enables sense amps 201–208 for sensing logic levels of a selected bit string and generating corresponding logic levels on bus lines 1–8 of the first bus.

Data drivers 211–218 each drive a bit of a selected bit string to a logic level corresponding to a logic level on a bus line of the first bus. Data drivers 211–218 are individually enabled and disabled for writing to portions of a selected bit string. Data drivers 211–18 each have an output respectively coupled to terminals BITs 1–8, a first input, and a second input respectively coupled to bus lines 1–8 of the first bus. Sense amps 201–208 and data drivers 211-218 correspond to read/write circuitry 24 of FIG. 2. Bus lines 1-8 of the first bus correspond to the first bus of FIG. 1.

OR gates 221-228 respectively enable data drivers 211-218 for writing a word to a selected bit string. In general, a word will be a subset (or portion) of a selected bit string. Control signals coupled to OR gates 221-228 are generated by control logic circuit 50 of FIG. 6. OR gate 221 has a first input coupled to node 61, a second input coupled to node 63, a third input coupled to node 65, a fourth input coupled to node 69, and an output coupled to the first input of data driver 211. OR gate 222 has a first input coupled to node 61, a second input coupled to node 63, a third input coupled to node 65, a fourth input coupled to node 69, and an output coupled to the first input data driver 212. OR gate 223 has a first input coupled to node 61, a second input coupled to node 63, a third input coupled to node 65, a fourth input coupled to node 67, and an output coupled to the first input of data driver 213. OR gate 224 has a first input coupled to node 61, a second input coupled to node 63, a third input coupled to node 67, and an output coupled to the first input of data driver 214. OR gate 225 has a first input coupled to node 61, a second input coupled to node 62, a third input coupled to node 64, a fourth input coupled to node 68, and an output coupled to the first input of data driver 215. OR gate 226 has a first input coupled to node 61, a second input coupled to node 62, a third input coupled to node 64, a fourth input coupled to node 68, and an output coupled to the first input of data driver 216. OR gate 227 has a first input coupled to node 61, a second input coupled to node 62, a third input coupled to node 64, a fourth input coupled to node 66, and an output coupled to the first input of data driver 217. OR gate 228 has a first input coupled to node 61, a second input coupled to node 62, a third input coupled to node 66, and an output coupled to the first input of data driver 218.

Multiplexers 231-234 couple data from the first bus to a second bus or vice versa. In the preferred embodiment, multiplexers 231-234 are one to one multiplexers each having an enable input. Multiplexer 231 is an 8 terminal multiplexer, multiplexer 232 is a four terminal multiplexer, and multiplexers 233 and 234 are two terminal multiplexers. For example, multiplexer 231 has a first group of 8 terminals and a second group of 8 terminals. Each terminal of the first group corresponds to a terminal of the second group, when the multiplexer is enabled the terminals of the first group are coupled to the corresponding terminals of the second group coupling the first bus to the second bus.

Multiplexers 231-234 are used to partition each bit string into words (corresponding to a word width) and to transfer a word to the first bus or the second bus (or vice versa). Multiplexers 231-234 correspond to multiplexer 26 and shifter 27 of FIG. 2. Control logic circuit 50 of FIG. 6 generates control signals for configuring the circuit of FIG. 8 for reading/writing words having 8 bits, 4, bits, 3 bits, and 2 bits. In the preferred embodiment, a word is always coupled to the lowest order bits of the second bus. For example, a two bit word occupying the seventh and eighth bits of a selected bit string (coupled to the first bus) must couple to the first and second bit location of the second bus (or vice versa during a write operation).

As shown in FIG. 8 only four multiplexers (231-234) are used for the four different word widths (8 bits, 4 bits, 3 bits, and 2 bits). Multiplexer 231 is used for all word widths. Multiplexer 232 is used for the four bit and three bit word widths. Multiplexers 233-234 are used for the two bit word width. Using the larger multiplexers for coupling smaller word widths between the first and second buses reduces the number of multiplexers required thereby reducing capacitance thereon and increasing memory access times.

Multiplexer 231 is an 8 bit multiplexer respectively coupling bits 1-8 of the first bus to bits 1-8 of the second bus. Multiplexer 231 is used to couple the lower order bits from the first bus to the second bus (or vice versa) for the 4 bit, 3 bit, and 2 bit word widths. For example, multiplexer 231 couples bits 1-4 (four bit word width), bits 1-3 (three bit word width), and bits 1-2 (two bit word width between the first and Second buses during read/write operations. Multiplexer 231 is also enabled for an 8 bit word width which is the same size as a bit string.

Multiplexer 232 is a four bit multiplexer respectively coupling bits 5-8 of the first bus to bits 1-4 of the second bus. In a four bit word width, multiplexer 232 couples bits 5-8 (upper order bits of a selected bit string) of the first bus to bits 1-4 of the second bus. In a three bit word width, multiplexer 232 couples bits 5-7 of the first bus to bits 1-3 of the second bus. In a two bit word width, multiplexer 232 couples bits 5-6 of the first bus to bits 1-2 of the second bus. Thus for a four bit word width, a bit string is divided into two, four bit words, multiplexer 231 couples to bits 1-4 and multiplexer 232 couples bits 5-8. Similarly, for a three bit word width, a bit string is divided into two, three bit words, multiplexer 231 couples to bits 1-3 and multiplexer 232 couples to bits 5-7. Two bits of a bit string remain unused for a three bit word width.

Multiplexers 233 and 234 are two bit multiplexers respectively coupling bits 7-8 and 3-4 of the first bus to bits 1-2 of the second bus. Multiplexers 233 and 234 couple to the remaining areas (bits 3-4 and bits 7-8) of a bit string not accessed by either multiplexers 231 and 232 for the two bit word width. Thus for a two bit word width, multiplexer 231 couples to bits 1-2, multiplexer 234 couples to bits 3-4, multiplexer 232 couples to bits 5-6, and multiplexer 233 couples to bits 7-8 of a selected bit string.

I/O (Inputs/Outputs) circuits 241-248 each comprise an input and an output circuit for providing a word from an external bus to the second bus (input circuit) or for providing a word from the second bus to the external bus (output circuit). I/O circuits 241-248 respectively have first terminals I/O 1-I/O 8 for coupling to an external bus, second terminals respectively coupled to lines 1-8 of the second bus, a third terminal coupled to the R/WB input for selecting between the input and output circuit, and a fourth terminal for enabling the I/O circuit. The fourth terminal of I/O circuits 241 and 242 are coupled to node 54. The fourth terminal of I/O circuit 243 is coupled to node 53. The fourth terminal of I/O circuit 244 is coupled to node 52. The fourth terminals of I/O circuits 245-248 are coupled to node 51. Control logic circuit 50 of FIG. 6 provides control signals for enabling I/O circuits 241-248 depending on the word size. In the preferred embodiment, the word is always coupled to the lowest numbered I/O circuit. For example, a two bit word is coupled to I/O circuits 241 and 242 or a four bit word is coupled to I/O circuits 241-244.

Operation of control logic circuit 50 (FIG. 6) and circuitry of FIG. 8 is described using the logic diagram of FIG. 7. In a first example, an 8 bit word width is chosen (the 8 bit enable input (FIG. 6) receives a logic one level) and both a read and a write sequence is explained. The 8 bit word width is equal to the bit string length in the memory (not shown). NAND gate 101 (FIG. 6) provides a logic one level at node 56 enabling multiplexer 231 (FIG. 8). Control logic 50 also generates logic one levels at nodes 51-54 enabling I/O circuits 241-248.

If the R/WB input (FIG. 6) is a logic one level (corresponding to a read condition) NOR gates 91-99 respectively generate logic zero levels at nodes 61-69 thereby disabling data drivers 221-228 (FIG. 8). The logic one level at the R/WB input also enables sense amps 201-208 (FIG. 8) and output circuits of I/O circuits 241-248 (FIG. 8). Thus a word provided at terminals BIT 1-8 (FIG. 8) is sensed by sense amps 201-208 and respectively provided to bus lines 1-8 (FIG. 8) of the first bus. Multiplexer 231 couples the word to the second bus (FIG. 8). Output circuits provide the word to terminals I/O 1-8.

If the R/WB input is a logic zero level (corresponding to a write condition) NOR gate 91 (FIG. 6) generates a logic one level at node 61 enabling data drivers 221-228. The logic zero level of the R/WB input also disables sense amps 201-208 and enables input circuitry of I/O circuits 241-248. Input circuitry of I/O circuits couples a word from terminals I/O 1-8 to the second bus. Multiplexer 231 couples the word from the second bus to the first bus. Data drivers 211-218 write the word on the second bus to a selected bit string coupled to terminals BIT 1-8.

In a second example, a two bit word is written (R/WB=0) into the seventh and eighth bit locations of a selected bit string coupled to terminals BIT 1-8. A logic one level is applied to the 2 bit enable input (FIG. 6) of control logic circuit 50 for selecting a two bit word width. A logic one level is applied to both the Address A and B inputs (FIG. 6) for selecting the seventh and eighth bits of a bit string (see logic diagram of FIG. 7). NAND gate 89 (FIG. 6) generates a logic one level at node 54 enabling I/O circuits 241 and 242 (I/O circuits 243-248 are disabled). The logic zero level applied to the R/WB input enables the input circuitry of I/O circuits 241 and 242 for providing a word applied to terminals I/O 1 and 2 to bus lines 1 and 2 of the second bus. Inverter 104 (FIG. 6) generates a logic one level at node 58 for enabling multiplexer 233. Multiplexer 233 couples the word on bus lines 1 and 2 of the second bus respectively to bus lines 7 and 8 of the first bus. NOR gate 66 (FIG. 6) generates a logic one level at node 66 enabling data drivers 217 and 218. Data drivers 211-216 and sense amps 201-208 are disabled. The word at bus lines 7 and 8 of the first bus is respectively written to the seventh and eighth bits (terminals BIT 7 and 8) of the selected bit string. The second example illustrates how a multiplexer is used to couple and shift a word to a specific location of a bit string. Another aspect is that specific data drivers are enabled to prevent the entire bit string from being overwritten.

In a third example, a three bit word is read (R/WB=1) from the first, second, and third bit locations of a selected bit string coupled to terminals BIT 1-8. A logic one level is applied to the 3 bit enable input (FIG. 6) of control logic circuit 50 for selecting a three bit word width. A logic zero level is applied to the Address A input for selecting bits 1-3 of the selected bit string. The logic one level of at the R/WB input generates logic zero levels at the outputs of NOR gates 61-69 thereby disabling data drivers 211-218. Sense amps 201-208 are enabled for sensing the selected bit string at terminals BIT 1-8 and providing logic levels corresponding to the selected bit string at the first bus. NAND gate 101 (FIG. 6) generates a logic one level at node 56 enabling multiplexer 231. Multiplexer 231 couples the logic levels corresponding to the selected bit string to the second bus. NAND gates 88 and 89 (FIG. 6) generate logic one levels respectively at nodes 53 and 54 for enabling I/O circuits 241-243 (I/O circuits 244-248 are disabled). The output circuits of I/O circuits 241-243 are enabled by the R/WB input being at the logic one level. I/O circuits 241-243 provide bits 1-3 of the selected word to terminals I/O 1-3. The third example illustrates how the larger multiplexers are used for word widths smaller than the multiplexer size thereby reducing the number of multiplexers required when providing a wide variety of word widths.

It should be obvious to one skilled in the art that the technique described herein above to minimize the number of multiplexers used is easily extended to larger bit strings having an increased number of word widths that must be generated.

An alternate circuit for making an SRAM configurable for different word widths is shown in FIGS. 9 and 11. A logic diagram illustrating logic states generated by the circuit of FIG. 9 is shown in FIG. 10. The alternate circuit shown in FIGS. 9 and 11 are designed so that each word width configuration is generated by changing metal interconnections between various sub-circuit blocks of a control circuit 250. In this example, control logic circuit 250 is based upon words derived from an 8 bit wide bit string coupled from the SRAM (not shown). An 8 bit wide bit string comprises an eight bit word, two 4 bit words, two 3 bit words, or four 2 bit words.

Control logic circuit 250 includes inputs WA1, WA2, CON1, and CON2. Inputs WA1 and WA2 form a two bit address for selecting data drivers and multiplexers. AND gates 265-268 and inverters 253-254 generate control signals coupled to nodes 395-398 (corresponding respectively to WD1-WD4). Inputs CON1 and CON2 select a word width configuration comprising either 8 bits, 4 bits, 3 bits, or 2 bits. AND gates 261-264 and inverters 251-252 generate control signals coupled to nodes 391-394 (corresponding respectively to BW2, BW3, BW4, and BW8). AND gates 271-302 and OR gates 310-317 form a decoder for enabling data drivers for writing a word to the SRAM. OR gates 310-317 respectively have outputs coupled to nodes DD8-DD1.

FIG. 10 is a logic diagram illustrating input combinations to inputs WA1, WA2, CON1, and CON2, and resulting output logic levels at nodes BW2, BW3, BW4, BW8, WD1-WD4, and DD1-DD8.

FIG. 11 is a block diagram of circuitry for configuring a SRAM for different word widths. The circuitry in FIG. 11 differs from the equivalent circuitry of FIG. 8 mainly in the arrangement of the multiplexers. In FIG. 8 eight bit multiplexer 231, four bit multiplexer 232, three bit multiplexer 233, and two bit multiplexer 234 are used to access different portions of a bit string. In this scheme, the larger multiplexers are also used for the smaller word widths.

In FIG. 11 an eight bit multiplexer 344, 2 four bit multiplexers 343, 2 three bit multiplexers 342, and 4 two bit multiplexers 341 are used to access different portions of a bit string. Each of the multiplexers couples between a first bus and a second bus. In this scheme, each multiplexer block converts an SRAM for a specific configuration. Eight bit multiplexer 344 is used for an eight bit word width. Four bit multiplexer 343 is used for a four bit word width and comprises two four bit multiplexers, a first four bit multiplexer couples to the lower order bits (1-4) of a bit string and a second four bit multiplexer couples to the higher order bits (5-8) of a bit string. Three bit multiplexer 342 is used for a three bit word width and comprises two three bit multiplexers, a first three bit multiplexers couples to the lower order bits (1-3) and a second three bit multiplexer couples to the higher order bits (4-6). Three bit multiplexer 342 does not couple to lines 7-8 of the first bus. Similarly, two bit multiplexer 341 is used for a two bit word width and comprises four two bit multiplexers. A first two bit multiplexer couples to bits 1-2 of a bit string, a second two bit multiplexer couples to bits 3-4 of a bit string, a third two bit multiplexer couples to bits 5-6 of a bit string, and a fourth two bit multiplexer couples to bits 7-8 of a bit string. Nodes BW2, BW3, BW4, BW8, and WD1-4 couple control signals to multiplexers 341-344.

Data drivers 351-358 respectively couple to nodes DD1-DD8 for receiving control Signals for individually enabling data drivers during a write operation. Sense amplifiers 361-368 and data drivers 351-358 receive a R/WB (Read/Writebar) signal for enabling sense amplifiers 361-368 during a read operation and data drivers 351-358 during a write operation.

I/O (Input/Output) circuitry 321-328 respectively couples to terminals I/O 1-I/O 8 for receiving and providing a word. I/O circuitry 321-328 receives the R/WB signal for enabling input circuitry during a write operation and output circuitry during a read operation. I/O circuitry 321-328 are individually enabled by OR gates 331-338. I/O circuitry 321 and 322 are permanently enabled. I/O circuitry 323 is enabled when a three, four, or eight bit word width is chosen. I/O circuitry 324 is enabled when a four or eight bit word width is chosen. I/O circuitry 335-338 is enabled when an eight bit word width is chosen.

Examples for illustrating read and write operations are described hereinafter. A write operation is performed writing a word into a fifth and a sixth bit of a selected bit string coupled to nodes MC1-MC8. A two bit word width is selected by setting the configuration inputs 81 (CON1) and 82 (CON2) to a logic zero level. This input combination (refer to FIG. 10) generates a logic one level at node 91 (BW2) and a logic zero level at nodes 92 (BW3), 93 (BW4), and 94 (BW8). Bits five and six of a bit string are accessed by setting word address input WA2 to a logic one level and word address input WA1 to a logic zero level. WA1 and WA2 at these logic levels will generate a logic one level at node 397 (WD3) and logic zero levels at nodes 395 (WD1), 396 (WD2), and 398 (WD4).

BW3, BW4, and BW8 at logic zero levels disables I/O circuitry 323-328 leaving I/O 1 and I/O 2 enabled for receiving a two bit word. The direction of the data flow through the I/O circuits is controlled by the R/WB signal. In this case, R/WB is at a logic zero level indicating a write operation. The data from I/O 1 and I/O 2 is respectively coupled to bus lines 371-372 of the second bus. Multiplexers 341-344 couple between the first and second buses but multiplexers 342-344 are disabled by BW3, BW4, and BW8 being at logic zero levels. Multiplexer 341 is enabled for coupling and shifting a word from the second bus to the first bus. BW2 and WD3 in the logic one level couples the first and second lines of the second bus to the fifth and sixth lines of the first bus and enables data drivers 365 and 366 (nodes DD5 and DD6 in a logic one logic level, see FIG. 10). The word at I/O 1 and I/O 2 is coupled respectively to data driver 355 and 356 which writes it to the fifth and sixth bit locations of a selected bit string. In the preferred embodiment, the multiplexers couple data via transmission gates formed from a P-channel MOSFET/N-channel MOSFET transistor pair well known by one skilled in the art. Shifting of a word to the appropriate location in a bit string is accomplished by the wiring of the multiplexer between the first and second buses.

A read operation is analogous to a write operation. A SRAM couples a selected bit string to nodes MC1-MC8. A three bit word is to be read from the fourth, fifth, and sixth bits of the selected bit string. The configuration signals CON 1 and CON2 are respectively at a logic zero level and a logic one level to configure the circuitry for a three bit word. This generates a logic one level at node BW3 (392) and logic zero levels at BW2, BW4, and BW8.

R/WB is at a logic one level for a read operation. A read operation activates sense amplifiers 361-368 and output circuitry of I/O circuitry 321-328. Data drivers 351-358 and input circuitry of I/O circuitry 321-328 are disabled during the read operation. Sense amplifiers 361-368 sense each bit of the selected eight bit word and provides the corresponding logic levels on lines 381-388 of the first bus.

BW3 in the logic one level activates multiplexer 342 for three bits word widths. WA1 and WA2 are respectively in a logic one level and a logic zero level which generates a logic one level at WD2 indicating a second word of the bit string is selected. Multiplexer 342 passes and shifts logic levels on the fourth, fifth, and sixth lines (384, 385, and 386) on the first bus respectively to the first, second, and third lines (371, 372, and 373) of the second bus. For a word width of three bits, I/O circuitry 323 is enabled by BW3 in the logic one level via OR gate 333. BW4, and BW8 at the logic zero level disables I/O circuitry 334-338. Output circuitry of I/O circuitry 321-323 provides the word from the fourth, fifth, and sixth bit locations of the selected bit string respectively at nodes I/O 1-I/O 3. Operation in the other word width configurations is similar to that described above.

By now it should be appreciated that a configurable SRAM has been provided that is configurable for different word widths. The configurable SRAM uses a full diffused memory array for maximizing speed and density. The configurable SRAM can be placed on a gate array without using a significant portion of the die area thereby increasing utilization of the gate array substantially over gate arrays reliant on memory formed using gate array transistors.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A word width configurable SRAM comprising:

a full diffused SRAM having a plurality of bit strings, each bit string having a predetermined number of bits;

a first bus coupled to said first diffused SRAM;

a multiplexer coupled to said first bus;

a shifter coupled to said multiplexer;

a second bus coupled to said shifter wherein said multiplexer and shifter couple lines of said first and second buses;

a plurality of I/O (Input/Output) circuits coupled to said second bus; and a control circuit for controlling said multiplexer and said shifter for reading or writing a word to a selected bit string.

2. The word width configurable SRAM as recited in claim 1 wherein said selected bit string comprises more than one word.

3. The word width configurable SRAM as recited in claim 2 wherein said control circuit is coupled for receiving configuration signals for selecting a word width and wherein said control circuit is coupled for receiving a word address for selecting bit locations within said selected bit string corresponding to said word.

4. The word width configurable SRAM as recited in claim 3 wherein said full diffused SRAM includes read and write circuitry.

5. The word width configurable SRAM as recited in claim 4 wherein said read circuitry senses said bit string during a read operation and provides said bit string to said first bus, wherein said control circuit enables a portion of said multiplexer for coupling said word of said bit string to said shifter, wherein said control circuit enables said shifter for shifting bits of said word adjacent to one another and provides said word to said second bus, and wherein output circuits of said plurality of I/O circuits are enabled for providing said word.

6. The word width configurable SRAM as recited in claim 5 wherein said input circuits of said plurality of I/O circuits are enabled for providing said word to said second bus during a write operation, wherein said control circuit enables said shifter for shifting bits of said word, wherein said control circuit enables said multiplexer for coupling said word to said first bus, and wherein said control circuit enables said write circuitry for writing said word into said selected bit string.

7. A circuit for making a SRAM configurable for providing different word widths, the SRAM comprising a plurality of bit strings and providing access to a selected bit string, the circuit comprising:

a first bus coupled to the SRAM;

a plurality of multiplexers coupled to said first bus;

a second bus coupled to said plurality of multiplexers; and a control circuit for selecting a multiplexer of said plurality of multiplexers, said multiplexer for coupling to a portion of said selected bit string of the SRAM, said multiplexer coupling and shifting bits of a word between said first and second buses.

8. The circuit as recited in claim 7 further including I/O (Input/Output) circuitry coupled to said second bus.

9. The circuit as recited in claim 8 wherein each bit string of the SRAM comprises more than one word and wherein said first and second buses have lines corresponding to each bit of said selected bit string.

10. The circuit as recited in claim 9 wherein the SRAM includes read circuitry for providing said selected bit string of the SRAM to said first bus during a read operation, wherein said multiplexer couples to lines of said first bus corresponding to a selected word of said selected bit string to said second bus and wherein said control circuit enables Output circuitry of said I/O circuitry for providing said selected word to other circuitry.

11. The circuit as recited in claim 10 wherein said control circuit enables Input circuitry of said I/O circuitry for coupling said word to said second bus, wherein said multiplexer couples said word to said first bus, and wherein the SRAM includes write circuitry for writing said word on said first bus to said selected bit string.

12. The circuit as recited in claim 11 wherein each multiplexer of said plurality of multiplexers includes a number of lines corresponding to a word width and each multiplexer couples to lines of said first bus corresponding to bits of said selected bit string.

13. The circuit as recited in claim 12 wherein said plurality of lines of each multiplexer coupled to said second bus are adjacent to one another.

14. A method for making a SRAM configurable for providing different word widths, the method comprising:

selecting a bit string of the SRAM wherein said bit string comprises more than one word;

reading said bit string to a first bus;

coupling said first bus to a second bus via a multiplexer; and enabling lines of said multiplexer for passing bits of said bit string corresponding to a word from said first bus to said second bus.

15. A method for making a SRAM configurable for providing different word widths, the method comprising:

selecting a bit string of the SRAM wherein said bit string comprises more than one word;

coupling said bit string of the SRAM to a first bus;

coupling said first bus to a second bus via a multiplexer;

providing a word to said second bus;

enabling lines of said multiplexer for coupling said word from said second bus to said first bus; and writing said word to said bit string.

* * * * *